(12) United States Patent
Siferd et al.

(10) Patent No.: US 7,034,730 B2
(45) Date of Patent: Apr. 25, 2006

(54) PIPELINED DELTA SIGMA MODULATOR ANALOG TO DIGITAL CONVERTER

(75) Inventors: Raymond E. Siferd, Beavercreek, OH (US); Saiyu Ren, Beavercreek, OH (US)

(73) Assignee: Wright State University, Dayton, OH (US)

( * ) Notice: Subject to any disclaimer, the term of this patent is extended or adjusted under 35 U.S.C. 154(b) by 0 days.

(21) Appl. No.: 10/957,354

(22) Filed: Oct. 1, 2004

(65) Prior Publication Data

US 2005/0083220 A1    Apr. 21, 2005

Related U.S. Application Data

(60) Provisional application No. 60/508,829, filed on Oct. 3, 2003.

(51) Int. Cl.
  *H03M 3/00* (2006.01)
(52) U.S. Cl. ........................ 341/143; 341/155
(58) Field of Classification Search ............... 341/143, 341/161, 155, 144, 120, 119
See application file for complete search history.

(56) References Cited

U.S. PATENT DOCUMENTS

| | | | | |
|---|---|---|---|---|
| 5,103,229 A | * | 4/1992 | Ribner | ........................ 341/143 |
| 5,710,563 A | | 1/1998 | Vu | |
| 5,838,272 A | | 11/1998 | Steiner et al. | |
| 5,936,562 A | | 8/1999 | Brooks et al. | |
| 5,982,313 A | | 11/1999 | Brooks et al. | |
| 6,061,008 A | * | 5/2000 | Abbey | ......................... 341/143 |
| 6,067,036 A | * | 5/2000 | Mauthe et al. | ............... 341/143 |
| 6,072,355 A | | 6/2000 | Bledsoe | |
| 6,124,820 A | | 9/2000 | Norman | |
| 6,137,431 A | * | 10/2000 | Lee et al. | .................... 341/161 |
| 6,166,675 A | | 12/2000 | Bright | |
| 6,188,345 B1 | | 2/2001 | McDonald et al. | |
| 6,271,782 B1 | | 8/2001 | Steensgaard-Madsen | |
| 6,295,016 B1 | | 9/2001 | Chiang | |
| 6,304,204 B1 | | 10/2001 | Norman | |
| 6,337,651 B1 | | 1/2002 | Chiang | |

(Continued)

OTHER PUBLICATIONS

Brooks, Todd L., et al.; A Cascaded Sigma-Delta Pipeline A/D Converter with 1.25 MHz Signal Bandwidth and 89 dB SNR; IEEE Journal of Solid-State Circuits, vol. 32, No. 12; Dec. 1997; pp. 1896-1906.

(Continued)

*Primary Examiner*—Jean Bruner Jeanglaude
(74) *Attorney, Agent, or Firm*—Dinsmore & Shohl, LLP (57) ABSTRACT

A pipelined delta-sigma modulator (PDSM) analog to digital converter (ADC) architecture is disclosed where each stage of the pipelined ADC includes a delta sigma modulator with a digital low pass filter and a corresponding analog low pass filter that precisely matches the digital low pass filter. An error signal is generated at each stage based on the difference of the low pass filtered analog input and the low pass filtered digital output of the delta sigma modulator (after converting to an analog signal). The digital outputs of each stage are passed through the appropriate low pass filter stages so all digital signals have been subjected to the same filtering prior to combining in a digital error correction circuit. The present invention also uses a compensation filter to correct any errors in the pass band caused by the low pass filtering and to help reject unwanted noise outside the pass band.

30 Claims, 3 Drawing Sheets

U.S. PATENT DOCUMENTS

| | | |
|---|---|---|
| 6,348,888 B1 | 2/2002 | Yu |
| 6,369,744 B1 | 4/2002 | Chuang |
| 6,466,153 B1 | 10/2002 | Yu |
| 6,489,904 B1 | 12/2002 | Hisano |
| 6,489,913 B1 | 12/2002 | Hansen et al. |
| 6,501,400 B1 | 12/2002 | Ali |
| 6,507,305 B1 * | 1/2003 | Andre et al. ............... 341/161 |
| 6,515,606 B1 | 2/2003 | Lyden |
| 6,518,905 B1 | 2/2003 | Siferd |
| 6,529,070 B1 | 3/2003 | Nagaraj |
| 6,538,592 B1 * | 3/2003 | Yang et al. ............... 341/155 |
| 6,580,383 B1 | 6/2003 | Davendorf et al. |
| 6,604,009 B1 * | 8/2003 | Eastty et al. ............... 700/94 |
| 6,750,795 B1 * | 6/2004 | Gupta ............... 341/143 |
| 2002/0024459 A1 | 2/2002 | Andre et al. |
| 2002/0039077 A1 | 4/2002 | Lyden |
| 2002/0041247 A1 | 4/2002 | Steensgaard-Madsen |
| 2002/0047790 A1 | 4/2002 | Ali |
| 2002/0060635 A1 | 5/2002 | Gupta |
| 2002/0105451 A1 | 8/2002 | Gulati et al. |
| 2002/0145546 A1 | 10/2002 | May |
| 2003/0058148 A1 | 3/2003 | Sheen |
| 2003/0080893 A1 | 5/2003 | Sakurai |

OTHER PUBLICATIONS

Brian Black; Analog-to-Digital Converter Architectures and Choices for System Design; Analog Dialogue 33-8 (1999); pp. 1-4, (no month).

* cited by examiner

PIPELINED DELTA SIGMA MODULATOR ANALOG TO DIGITAL CONVERTER

STATEMENT OF RELATED APPLICATIONS

This application claims the benefit of U.S. Provisional Application No. 60/508,829 filed Oct. 3, 2003, the entire teachings of which are herein incorporated by reference.

STATEMENT OF GOVERNMENT INTEREST

This invention was made with Government support under contract F3361-01-C-1860 awarded by the U.S. Air Force.

BACKGROUND OF THE INVENTION

The present invention relates generally to analog to digital converters, and more particularly to analog to digital converters comprising a pipelined, delta sigma modulator architecture.

Analog to digital converters (ADCs) provide the link between analog and digital domains. The ADC must be capable of converting analog data to digital data in an accurate manner, appropriate to the bandwidth and resolution requirements of particular application. Digital circuitry has become increasingly prevalent in a wide variety of electronic devices including telecommunications, audio, video, portable/mobile communication transmitters and receivers. Analog components can be eliminated with the corresponding reduction in size, weight, and power consumption by converting from analog to digital signals near the front end of a signal processing train. Converting to digital signals near the front end of the signal processing train usually requires a broad band/high resolution ADC, so there is much demand for ADCs with increased resolution and larger bandwidths.

One type of ADC is called a Nyquist rate converter. The sampling frequency for a Nyquist rate ADC must be at least twice the bandwidth of the input signal, such as for example, a bandwidth of 25 MHz would require at least a 50 MHz sampling frequency. A straightforward implementation of a Nyquist rate ADC is a flash converter where $2^n-1$ comparators are used to directly measure an analog signal to a resolution of n bits. The flash architecture has the advantage of being very fast, because the conversion occurs in a single ADC cycle. The disadvantage of this approach is that it requires a large number of comparators that are carefully matched and properly biased to ensure that the results are linear. Since the number of comparators needed for an n-bit resolution ADC is equal to $2^n-1$, limits of physical integration and input loading keep the maximum resolution relatively low. For example, a 4-bit ADC requires 15 comparators, an 8-bit ADC requires 255 comparators, and a 16-bit ADC would require 65,535 comparators.

One technique for alleviating the requirement for the large number of comparators is to use a pipelined ADC. A pipelined ADC divides the conversion task into several consecutive stages (T). For a pipelined ADC, the first stage produces the most significant bits (K-bits) and each successive stage produces the next K-bits, so that T stages would yield T*K-bits of resolution. This process is repeated through as many stages as are necessary to achieve the desired resolution. A typical range for K would be 1–4 bits and in some implementations K may vary between stages.

Each stage requires an analog sample/hold circuit, a K-bit flash converter, a K-bit digital to analog converter, an analog subtract circuit, and an analog multiplier circuit. The digital outputs of each stage must be appropriately delayed and combined to obtain a new digital output word each clock cycle. In practice, each stage of the pipelined ADC must produce at least K+1 bits to obtain K-bits of accuracy. In principle, a pipelined converter with P pipelined stages, each with an M-bit flash converter, can produce a high-speed ADC with a resolution of N=P*M bits using $P*(2^M-1)$ comparators. For example, a 2-stage pipelined converter with 8-bit resolution requires 30 comparators, and a 4-stage 16-bit ADC requires only 60 comparators. However, although the Nyquist rate pipelined ADC reduces the number of comparators, some critical analog components are still required, which must be very accurate, such as sample/hold, subtract, and multiplier.

A second type of ADC is an over-sampling converter based on delta sigma modulation. Over-sampling ADCs are used in applications requiring high resolution because the approach permits high resolution without the need for extremely tight tolerances for analog components. The delta sigma modulator ADC combines feedback with an analog integrator to shift the quantization noise to higher frequencies outside the bandwidth of the signal. The digital output is then passed through a low pass filter to remove the quantization noise that has been shifted to higher frequencies. This permits the use of 1 to 4 bit flash ADCs (quantizers) to obtain more bits of resolution after low pass filtering. The increase in the number of bits depends on the over sampling ratio (OSR). The OSR is the ratio of the sampling frequency to twice the bandwidth (Nyquist Frequency) of the input signal. For a conventional first order (one integrator) delta sigma modulator, the signal to noise ratio increases by 9 db (1.5 bits) for each doubling of the OSR. OSRs typically range from 8 to 256, depending on the application.

The pipelined ADC is good for broadband applications, since it needs to sample only at the Nyquist rate, but it is difficult to obtain high resolution because of the component accuracy requirements and the need for many stages. On the other hand, the delta sigma modulator ADC is good for high resolution, but it is difficult to obtain broad bandwidths because of the required OSR.

SUMMARY OF THE INVENTION

It is against the above background that the inventors have recognized a need for broadband and high resolution ADCs that can provide suitable performance, even at a relatively low oversampling rate (OSR).

The present invention overcomes the disadvantages of previously known delta sigma analog to digital converters by combining the bandwidth advantages of the pipelined analog to digital converter (ADC) architecture with the relatively high resolution capabilities of the delta sigma modulator to obtain a broadband and high resolution ADC that can provide suitable performance, even at a relatively low oversampling rate (OSR). The present invention also provides these capabilities with relatively fewer numbers of pipelined stages.

In one embodiment of a pipelined delta sigma modulator (PDSM) ADC according to the present invention, an analog input signal is split into two paths in a first stage. The first path is defined by an analog delay and analog low pass filter, and provides a filtered and delayed analog signal. The second signal path produces an analog approximation of the K-bits of the analog input signal. The second path is defined by a first delta sigma modulator that incorporates an L-bit quantizer, a first digital low pass filter, and a digital to analog converter (DAC). An L-bit output of the first delta sigma modulator is passed through the first digital low pass filter to provide the digital representation of the K-bits of the analog input signal. The K-bit digital output of the first digital low pass filter is then passed through a digital to analog converter (DAC) to provide the analog approximation of the K-bit digital output. The analog approximation of the K-bit digital output from the DAC is then subtracted from the filtered and delayed analog signal in a subtract circuit, and an appropriate gain is provided by a gain circuit to the difference computation of the subtract circuit to provide an amplified error signal for further processing by subsequent stages. Notably, the digital and analog low pass filters are matched so that the two signals that are subtracted by the subtract circuit have been subjected to the same transfer function.

In another embodiment, the amplified error signal from the first stage is coupled into a second delta sigma modulator of a second stage. The second delta sigma modulator produces an L-bit output that is passed through a second digital low pass filter that provides a J-bit digital output. Referring back to the first stage, the K-bit output of the first digital low pass filter is additionally processed through a digital delay and a third digital low pass filter that has a transfer function that corresponds with the second digital low pass filter to produce a delayed R-bit digital signal.

The J-bit digital output of the second digital low pass filter and the delayed R-bit digital output are provided to a digital error correction circuit. The digital error correction circuit produces a P-bit digital output which is provided to a digital reconstruction/decimation filter takes the P-bit digital output and produces an N-bit digital output that compensates for amplitude variations to the signal as a result of the circuit filtering. In some cases, the sampling frequency of the output signal is decimated. Although the above embodiments mentioned above only discuss two stages, the above signal processing train serves as a basis for adding additional stages in general.

Although the present invention is not limited to specific advantages or functionality, it is noted the PDSM ADC of the present invention provides the following improvements over previous pipelined ADCs. Relatively high resolution is obtained with at least two stages of pipeline by using delta sigma modulators to shift the quantization noise to higher frequencies and by using low pass averaging filters to reject the quantization noise in each of the stages. Relatively high resolution is obtained with relatively low over sampling ratios by using the delta sigma modulators and low pass filters in a pipelined architecture. The low over sampling ratios permit broadband operation with achievable sampling rates. Relatively high resolution is obtained with reduced requirements for component accuracy. The noise shaping of the delta sigma modulators reduces the modulator component accuracy requirements.

Further advantages include reduced component accuracy requirements of the digital to analog converter, analog subtract, and analog multiply circuits because of the averaging filter in the error signal path of the second stage. The cascade of two averaging filters each of length M results in randomizing the effects of component inaccuracies so that individual component tolerances can be increased. The accuracy requirements of the analog sample/hold circuits are reduced because of the analog averaging circuits in the first stage. The digital low pass filters in the second stage increase the number of bits at their outputs resulting in more over lap of the first and second stage digital signal that are being combined in the digital error correction circuit. This causes some randomizing of the interface (boundary) between the two signals and relaxes the component accuracy requirements as well as the need for more sophisticated digital error correction techniques.

Other features and advantages of the present invention will be apparent in light of the description of the invention embodied herein.

BRIEF DESCRIPTION OF THE DRAWINGS

The organization and manner of operation of the invention, together with further features and advantages thereof, may best be understood by reference to the following description taken in connection with the accompanying drawing in which.

DETAILED DESCRIPTION

In the following detailed description of the preferred embodiments, reference is made to the accompanying drawings that form a part hereof, and in which is shown by way of illustration, and not by way of limitation, specific preferred embodiments in which the invention may be practiced. It is to be understood that other embodiments may be utilized and that logical and electrical changes may be made without departing from the spirit and scope of the present invention.

Figure 1:
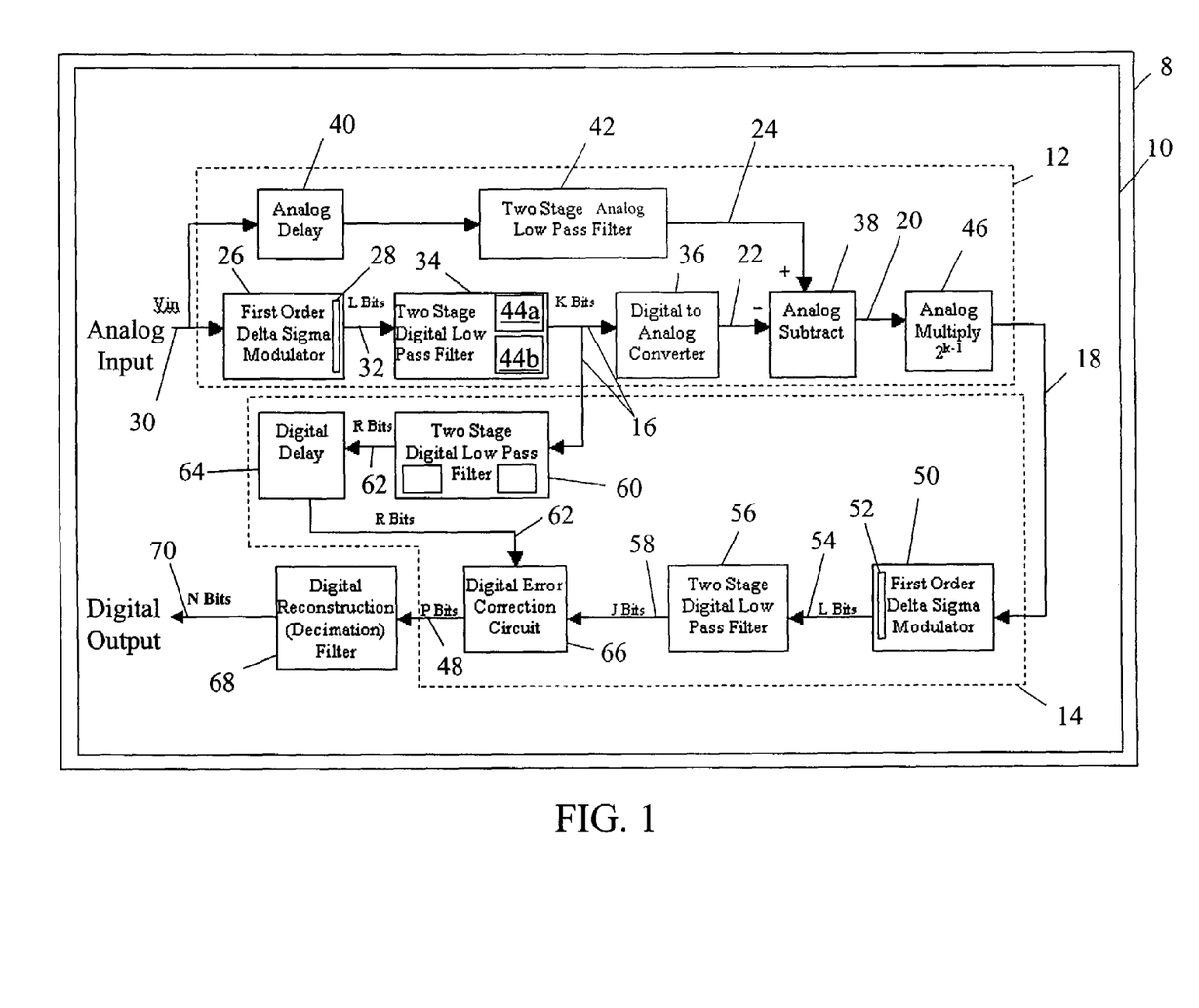
FIG. 1 is a schematic illustration of one embodiment of a pipelined delta sigma modulator (PDSM) ADC architecture according to the present invention.

Referring to FIG. 1, a schematic illustration of one embodiment of a device 8 having a pipelined delta sigma modulator (PDSM) ADC 10 according to the present invention is shown. The device 8 may be a wide variety of electronic devices including telecommunications, audio, video, portable/mobile communication transmitters and receivers. It is to be appreciated that the PDSM ADC 10 combines the features of the pipelined and delta sigma modulator ADCs to obtain a broadband/high resolution ADC with relatively low OSRs and relatively modest requirements for component accuracy, and very few stages.

The PDSM ADC 10 shown in FIG. 1 incorporates two stages of pipeline, indicated by symbols 12 and 14. The function of the first stage 12 is to produce a most significant bit (K-bit) digital output signal 16 and an amplified analog error signal 18 for further processing by subsequent stages. The error signal 18 is a resulting analog signal 20 provided with gain. The resulting analog signal is the results of a difference computation between an analog approximation signal 22 of the K-bit digital output signal 16 and a filtered and delayed analog signal 24.

To generate the above mentioned signals 16, 18, 20, 22, and 24, the first stage 12 in a first signal path uses a delta sigma ($\Delta\Sigma$) modulator 26 with an L-bit quantizer 28 sampling at a frequency of $f_s$. An analog input signal 30 is inputted into the $\Delta\Sigma$ modulator 26 to provide a L-bit output signal 32. The L-bit output signal 32 of the $\Delta\Sigma$ modulator 26 is passed through a digital low pass filter 34 to generate the K-bit digital output signal 16 which is a filtered output of J-bits with an accuracy of K-bits. The value of J depends on the value of L and the performance characteristics of the digital low pass filter 34. The value of K depends on the over sampling ratio [$f_s/(2*Bandwidth)$] and also the performance characteristics of the digital low pass filter 34. A range of values for L, J, and K is 1–4, 3–10 and 3–7, respectively, with an over sampling ratio of 8–10.

In the first stage 12, the K-bit digital output signal 16 is converted to the analog approximation signal 22 using a K-bit digital to analog converter 36. The analog approximation signal 22 from the DAC 36 is then inputted to a subtract circuit 38. The analog input signal 30, in addition to being passed to the first signal path, is passed through a second signal path having an analog delay 40 and an analog low pass filter 42. The analog low pass filter 42 matches the digital low pass filter 34 so that the subtract circuit 32 has analog inputs 22, 24 that have been subjected to the same transfer function. Therefore, the digital low pass filter 34 must be carefully selected so that it can be implemented in both the analog and digital domains resulting in the same transfer function. In one embodiment, the digital low pass filter 34 is a cascade of two averaging filters 44a, 44b. Each averaging filter 44a, 44b forms the average of the most recent (M) values of the input and is relatively easy to realize for digital and analog inputs. The value of M and $f_s$ determine the effective pass band of such averaging filter 44a, 44b.

The resulting analog signal 20 from the analog subtract circuit 38 has a magnitude that is less than $\frac{1}{2}^{K-1}$. The resulting analog signal 20 is then multiplied by $2^{K-1}$ in a gain circuit 46 so that the error signal 18 has a dynamic range that is the same as the analog input signal 30.

The second stage 14 takes the K-bit digital output signal 16 and the error signal 18 as inputs and produces a P-bit digital signal 48, which can be viewed as the sum of a digital representation of both the analog input signal and the analog amplified error signal plus a small random dither signal. To produce the P-bit digital signal 48, the analog error signal 18 is inputted to a second ΔΣ modulator 50 having a L-bit quantizer 52, the least significant bits (L-bit) digital signal 54 of which is then provide to a second digital low pass filter 56. The J-bit digital signal 58 of the second digital low pass filter 56 represents a digital version of the error signal 18. As discussed above the value of J depends on the value of L and M. For example, if L=4 and M=8, then J=10.

The K-bit digital output signal 16 from the first stage 12 is passed through a third digital low pass filter 60 to produce a most significant bits (R-bit) digital signal 62. It is to be appreciated that the third digital low pass filter 60 is the same as the second digital low pass filter 56 so that the R-bit digital signal 62 will be consistent with the J-bit digital signal 58. In general, R is greater than K and depends on the value of K and M. For example, if K=3–7 bits, then R=9–13 bits for M=8.

The R-bit digital signal 62, after passing through a digital delay 64, is digitally added with the J-bit digital signal 58 with the proper shifting/weighting in a digital error correction circuit 66 to provide the P-bit digital signal 48 of the second stage 14. Note that after passing the K-bit digital output signal 16 from the first stage 12 through the third digital low pass filter 60, the result is the R-bit digital signal 62, which in one embodiment, K=7 and R=13. In such an embodiment, the R-bit digital signal 62 is accurate to more than 7 bits after passing through the third digital low pass filter 60, but not accurate to 13 bits. Similarly, L-bit digital signal 54 after passing through the low pass filter has J-bits, which in one embodiment, for example, J=10. The J-bit digital signal 58 may be viewed as the error signal 18 plus some dither.

In one embodiment, the second and third low pass filters 56 and 60 are each a two-stage averaging digital filter. Accordingly, one effect of the third digital low pass filter 60 is to increase the amount of over lap of the K-bit digital output signal 16 from the first stage 12 with the J-bit digital signal 58 in the digital error correction circuit 66. In one embodiment, for example, if K=7, J=10, and R=13, then the overlap is 7 bits after dividing the J-bit digital signal by $2^{k-1}$ (shifting to right K−1 positions). This additional over lap results in some randomizing in the digital error correction circuit 66 and helps to compensate for component accuracy errors.

Finally, the P-bit digital signal 48 is the input signal to a digital reconstruction filter 68. This filter 68 compensates for any droop in magnitude caused by the averaging digital low pass filters 56 and 60, provides additional filtering in the stop band, and decimates the sampling frequency if appropriate to the application. A final digital output 70 has N-bits of resolution, with N≧P.

A more detailed description of stages 12 and 14 of the PDSM ADC 10 is provided in the following sections.

Stage One

As stated earlier, the function of the first stage 12 is to generate a signal representing the K most significant bits, as well as generating an amplified signal represent the analog difference between the input signal and the analog equivalent of the K-bit output of the first stage. In one embodiment, the PDSM ADC 10 incorporates a first order delta sigma modulator 26 and a digital low pass averaging filters 44a, 44b to produce more resolution in each stage. The first order delta sigma modulator 26 of the first stage 12 outputs the L-bit digital signal 32, which is the sum of signal component $[z^{-1}Vin(z)]$ and a quantization noise component $[(1-z^{-1})E(z)]$. Vin(z) is the analog input 30 to the modulator 26 and E(z) is the quantization noise resulting from converting the input to the L-bit digital signal 32 and the quantizer 28. The signal component $[z^{-1}Vin(z)]$ is the input signal 30 delayed by one clock cycle, while the noise component $[(1-z^{-1})E(z)]$ is shaped by the transfer function $(1-z^{-1})$. The magnitude of $(1-z^{-1})$ as a function of frequency is described by Equation (1):

$$|1-z^{-1}| = 2\sin\left(\frac{\pi f}{f_s}\right) \quad (1)$$

where $f_s$ is the sampling frequency of the modulator. Thus, the quantization noise E(z) is diminished for input frequencies that are small compared to $f_s$ by the noise shaping transfer function. The amount of attenuation is proportional to the over sampling ratio (OSR) which is defined by Equation (2):

$$OSR = f_s/(2*Bandwidth) \quad (2)$$

A well known result is the maximum signal to noise ratio for a first order modulator with an L-bit quantizer which is described by Equation (3):

$$S/N(db) = 6.02*L - 3.41 + 30 \log OSR \quad (3)$$

From Equation (3), it is seen that in one embodiment, if the L-bit digital signal 32 of the modulator 26 is passed though a perfect low pass filter 34 to reject out of band noise, then the S/N ratio would be 50.7 db for an OSR of 10 and for L=4 bits. A S/N ratio of 50.7 db corresponds to over 8 bits of resolution. Since the delta sigma modulator 26, quantizer 28, and low pass filter 34 are not perfect, the actual resolution is more likely to be 7 bits for an OSR of 10 and L=4 bits. In any case, it is seen that resolutions of 6–8 bits can be obtained in each stage of the PDSM ADC 10 for relatively low values of OSR.

As mentioned previously, in one embodiment the low pass filter 34 is a cascade of two averaging filters 44a and 44b, which result in a sinc$^2$ frequency response. The transfer function for each one of the averaging filters 44a, 44b is described by Equation (4):

$$T_{ave}(z) = \frac{1}{M}\sum_{i=0}^{M-1} z^{-i} \quad (4)$$

The frequency response of Tave(z) can be expressed by Equation (5):

$$T_{ave}(\omega) = \frac{\frac{1}{M}\sin\left(\frac{\pi M f}{f_s}\right)}{\sin\left(\frac{\pi f}{f_s}\right)} \approx \frac{\sin\left(\frac{\pi M f}{f_s}\right)}{\frac{M\pi f}{f_s}} \equiv \mathrm{sinc}\left(\frac{\pi M f}{f_s}\right) \quad (5)$$

Each filter has its first null at f=$f_s$/M, so a reasonable choice for M is M=0.8*OSR=0.8*$f_s$/(2*Bandwidth). This choice for M insures that the magnitude of the in band signal is attenuated by no more than 23% for each filter stage. This attenuation of the in band signals must be precisely offset by the final digital reconstruction filter 66.

The output (not shown) of the averaging filters 44a, 44b will have J-bits where J>L. For example, in one embodiment if L=4 bits and M=8, corresponding to an OSR=10, then J=10 bits. As discussed above, for an OSR=10, accuracy of about K=7 bits at the output of the two stage low pass filter is expected. So K-bits of the J-bit low pass filter output is the K-bit digital output signal 16 inputted to the digital to analog converter (DAC) 36, and the second digital low pass filter 60 of the second stage 14. The output of the DAC 36 is the analog approximation signal 22, which can be considered the sum of the analog input signal Vin(z) and the quantization error $E_1$(z) after passing through the low pass filter 34; which is described by Equation (6):

$$V_d(z)=[V\mathrm{in}(z)+E_1(z)][T\mathrm{ave}]^2 \quad (6)$$

It is to be appreciated that the low pass filter 34 rejects much of the quantization noise that has been shifted to higher frequencies by noise shaping of the delta sigma modulator 26, so $V_d$(z) 22 is now a signal that has been limited to frequencies that are approximately equal to the bandwidth of the analog input signal 30. The analog approximation signal $V_d$(z) 22 is an input to the analog subtract circuit 38. The other input 24 to the analog subtract circuit 38 is the analog input signal Vin(z) 30 after passing through in one embodiment, a cascade of two analog sinc averaging filters 42. The analog sinc averaging filters 42 can be realized in a straight forward manner with a circular buffer track and hold circuit and analog adder. The frequency response of the analog low pass filter 42 and analog delay 40, is exactly the same as the digital low pass filter 34 of the first stage 12. Thus, the filtered and delay analog signal 24 input to analog subtract circuit 38 is expressed by Equation (7):

$$V'\mathrm{in}(z)=V\mathrm{in}(z)[T\mathrm{ave}(z)]^2 \quad (7)$$

It is very important that the digital and analog low pass filters 34 and 42, respectively, have identical transfer functions. The resulting analog signal 20 of the subtract circuit 38 is expressed by Equation (8):

$$V_{sub}(z)=-E_1(z)[T\mathrm{ave}(z)]^2 \quad (8)$$

It is to be appreciated that for conventional pipelined ADCs, the output of the DAC is an unfiltered sum of the input signal and the quantization noise of flash first stage ADC. The quantization error from a flash ADC has a uniform spectral density function (constant over frequency from 0 to $f_s$/2). Thus, the quantization error has a magnitude that uniformly distributed between +/−Δ/2 (where Δ is the resolution of the flash ADC) and has a frequency that is equally likely to be any value from 0 to $f_s$/2.

On the other hand, for the PDSM ADC 10 of the present invention, the quantization noise at the output of the sigma delta modulator 32 has been shifted to higher frequencies by modulator noise shaping. Additionally, the low pass filter 34 rejects most of the high frequency noise components to reduce the power of the quantization noise and increase resolution of the first stage 12 from L to K-bits. It is also noted that any linearity error of the first stage modulator 26 and quantizer 28 would be included in the error denoted as $E_1$(z) above and offset by the error correction. The final operation of the first stage 12 is to multiply the resulting analog signal 20 of the subtract circuit by $2^{K-1}$ to obtain the error signal 18 that has the same dynamic range as the analog input signal 30.

Stage Two

The error signal 18 of the first stage 12 is then the input to the second stage modulator 50. The second stage modulator/low pass filter combination 50 and 56 operate in the same manner as the first stage 12 to produce a J-bit digital representation signal 58 of the amplified analog error signal 18, which is described by [$E_1$(z)$2^{K-1}T^2$ave(z)].

The J-bit digital signal 58 of the low pass filter 56 can be expressed as Equation (9):

$$V_{dJ}(z)=[-E_1(z)2^{K-1}T^2\mathrm{ave}(z)+E_2(z)]T^2\mathrm{ave}(z) \quad (9)$$

where $E_2$(z) is the noise shaped quantization error of the second stage modulator 50.

The K-bit digital output signal 16 of the first stage 12 is passed through the third digital low pass filter 60 to produce the R-bit digital signal 62 that can be expressed as Equation (10):

$$V_{dR}(z)=[V\mathrm{in}(z)+E_1(z)]T^4\mathrm{ave}(z) \quad (10)$$

The digital error correction circuit 66 adds $V_{dJ}$(z) and $V_{dR}$(z) after shifting $V_{dJ}$(z) k−1 places to the right (divide by $2^{K-1}$) to obtain the P-bit digital signal 48, which is described by Equation (11):

$$V_{dP}(z)=V\mathrm{in}(z)T^4\mathrm{ave}(z)+E_2(z)T^2\mathrm{ave}(z)/2^{K-1} \quad (11)$$

where $E_2$(z) is quantization noise from the second stage modulator 42.

As discussed above, the low pass filters 56 and 60, of the second stage 14 increase the bits that are combined in the digital error correction circuit 66 causing more overlap and some randomizing of the interface between the two signals.

Finally the P-bit digital signal $V_{dP}$(z) 48 is passed through the digital reconstruction filter 68 (and decimation if appropriate). The digital reconstruction filter 68 has a frequency response of $T^{-4}$ave(z) for frequencies in the pass band, so it compensates for the amplitude reduction caused by the averaging filters in low pass filter 60. The digital reconstruction filter 68 is adapted to reject signals with frequencies higher than the pass band, including quantization noise. This facilitates obtaining a final resolution of N-bits where N>2K.

Thus, it is to be appreciated that the PDSM ADC 10 allows high resolution with at least two stages 12 and 14, and with relatively low over sampling ratios and relatively high bandwidths. In addition, the accuracy requirements of key components in the first stage 12 (digital to analog converter, analog subtract, and analog multiply) are reduced because of the action of the digital low pass filters 56 and 60 of the second stage 14. In one embodiment, the cascade of two averaging filters of length M in each low pass filter 56 and 60 cause a randomizing of component mismatch errors and other uncorrelated errors which will tend to average to zero. Accordingly, the digital low pass filters 56 and 60 also increase the number of bits that are combined in the digital error correction circuit 66 resulting in some randomizing of the interface between the two signal being combined. This reduces the component accuracy requirements and helps eliminate the need for sophisticated error correction techniques. Similarly, the analog low pass filter 42 of the first stage 12 helps to reduce the accuracy requirements of the first stage analog sample and hold, and adder circuits. Also due to the non-linearity errors of the first stage modulator 26, L-bit quantizer 28 are included in the first stage error signal 18 which are then canceled out by the digital correction circuit 66 of the second stage 14 at the output of the PDSM ADC 10.

Additional stages can be added for higher resolution. For example, if three stages are required the second stage would need a DAC, analog-averaging filter, analog subtract, and analog multiplier circuit like the first stage. Then the third stage would be the same as the second stage described above. If the third stage needs to supply only L−1 bits, then the third stage would need only an L-bit quantizer.

The PDSM ADC 10 provides the potential to increase the bandwidth/resolution envelope compared to currently available ADCs. The PDSM ADC two-stage architecture shown by FIG. 1 was verified using MATLAB's Simulink® simulator software, which down stated the high resolution/broad bandwidth performance of the present invention. The Simulink version of the two-stage PDSM ADC is shown by FIG. 2.

For the simulation, the delta sigma modulators were implemented with 4 bit quantizers and all analog mathematical functions were ideal. The cascaded averaging filters were of length M=8, and were realized by using the appropriate transfer function in the z domain. The reconstruction filter was implemented by a gain factor that were equal to T−4ave(ω), where ω is the frequency of the input signal. Thus, the reconstruction filter compensated over for the attenuation of input amplitude caused by the low pass filters, but did not provide any additional filtering action to further eliminate quantization noise. The resolution was determined by subtracting the input signal from the final output signal of the ADC to determine the error.

Figure 2:
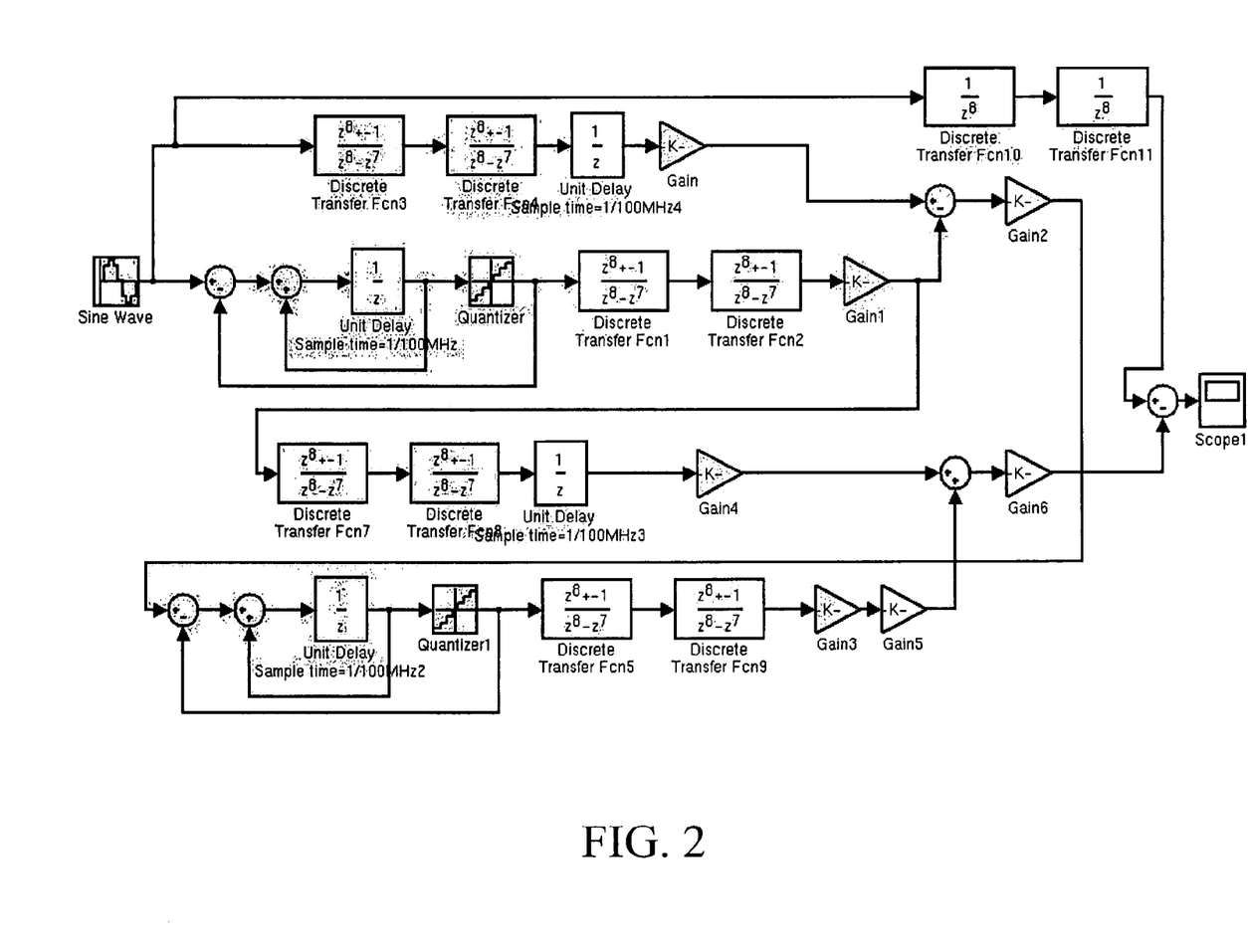
FIG. 2 is a schematic illustration of another embodiment of a pipelined delta sigma modulator (PDSM) ADC architecture according to the present invention and used in a simulator.
Figure 3:
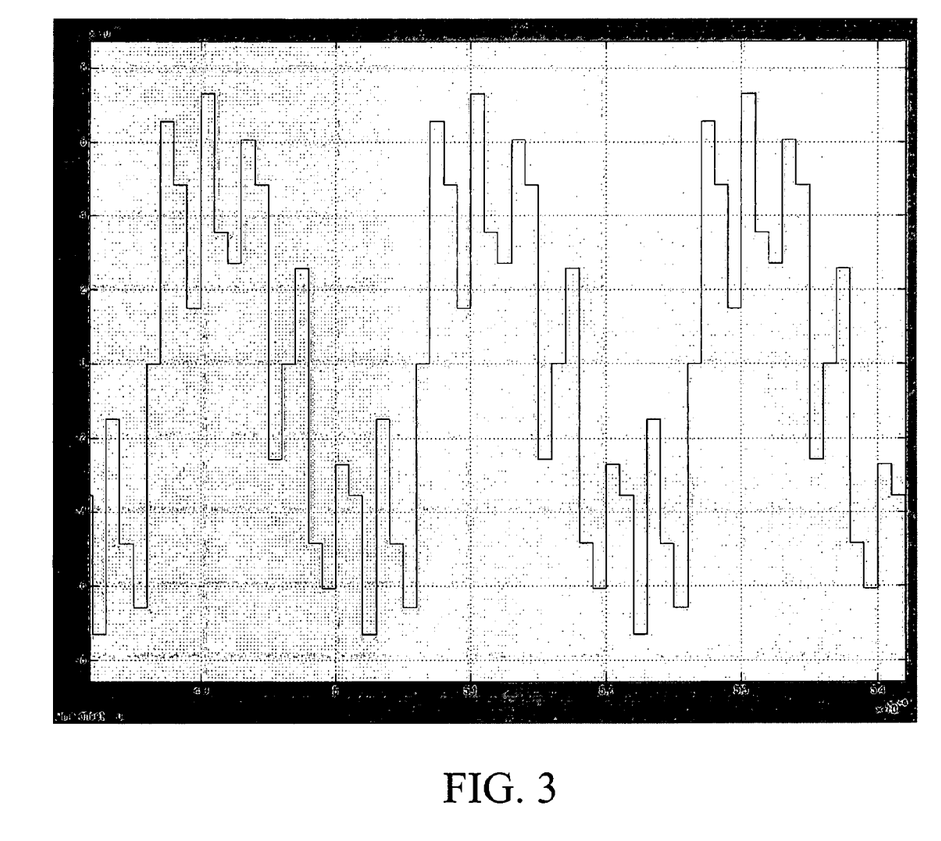
FIG. 3 is a graphical illustration of the output error for the PDSM ADC architecture of FIG. 2

A plot of output error (input signal−output signal) is shown in FIG. 3 for a 5 MHz input signal with peak amplitude of 1, and a sampling frequency of 100 MHz (OSR=10) used in the simulation software outlined by FIG. 2. As illustrated, an error indicates greater than 13 bit resolution can be obtained with the two stage PDSM ADC 10 with an OSR=10 and using the two stage averaging filters with M=8. Similarly results are obtainable for any case where the OSR=10; for example an input frequency of 50 MHz and sampling frequency of 1 GHz. If the OSR is increased to 12.5, then the resolution increases to over 14 bits. If the reconstruction filter included rejection of noise beyond the pass band, then results are improved.

Additional resolution can be obtained by using a three-stage PDSM architecture as discussed above. The third stage is only a 4 bit quantizer, since the objective is 16 bit resolution. This configuration was captured using MATLAB/SIMULINK and the simulation results for an OSR=10 and M=8 indicates the resolution is greater than 16 bits. The Matlab simulation results demonstrate the feasibility of the PDSM architecture using the cascade of two synchronized averaging filters of length M, where M=0.8*OSR. The results demonstrate high resolution with relatively low over sampling ratios and only 2 or 3 stages of pipelining.

Implementation

A two-stage version of the PDSM ADC 10 has been designed using the TSMC 0.35 µm CMOS process. The PDSM ADC 10 in this embodiment uses first order delta sigma modulators with 4 bit quantizers, averaging filters of length 8, and sampling frequencies of 100 MHz. Simulations indicate that for an input of 5 MHz (OSR=10), the first stage produces 6–7 bits and the second stage produces 7–8 bits of resolution.

While the invention has been particularly shown and described with reference to the preferred embodiments thereof, it will be understood by those skilled in the art that various changes in form and details may be made without departing from the spirit and scope of the invention encompassed by the appended claims.

What is claimed is:

1. A pipeline delta sigma modulator (PDSM) analog to digital converter (ADC) comprising:

a plurality of stages each having a delta-sigma modulator providing digital output to a digital low pass filter, wherein said digital output of each said delta-sigma modulator is low pass filtered by said digital low pass filter in a manner that precisely corresponds to filtering in a subsequent stage of the PDSM ADC, and a digital error correction circuit adapted to compensate for a digital representation of an analog input signal to the PDSM ADC in a manner that is inverse to effects of said low pass filter in order to restore spectrum of said digital output to correspond with spectrum of said analog input signal.

2. A PDSM ADC as recited in claim 1 further comprising a subtract circuit and a gain circuit, wherein said gain circuit is adapted to provide gain to output of said subtract circuit and avoid overdriving said subsequent stage by multiplying the output by $2^{k-1}$.

3. A device having a pipeline delta sigma modulator (PDSM) analog to digital converter (ADC) comprising:

a first stage having a first and second signal paths which split an analog input signal, said first path is defined by an analog delay and an analog low pass filter, said second signal path is defined by a first delta sigma modulator and a digital low pass filter, said first path couples a filtered and delayed analog signal outputted from said analog low pass filter with an analog output signal from said second signal path, said analog output signal being an approximation of most significant (K) bits of the analog input signal, wherein said digital and analog low pass filters of said first and second paths are matched so that both said filtered and delayed analog signal and said analog output signal have been subjected to the same transfer function.

4. A device as recited in claim 3 wherein said first delta sigma modulator is a first-order delta sigma modulator.

5. A device as recited in claim 3 wherein said analog low pass filter is a two-stage analog low pass filter.

6. A device as recited in claim 3 wherein said digital low pass filter is a two-stage digital low pass filter.

7. A device as recited in claim 3 wherein said first delta sigma modulator incorporates an L-bit quantizer.

8. A device as recited in claim 3 wherein said first delta sigma modulator incorporates an L-bit quantizer, and L-bit output of said first delta sigma modulator is passed through said digital low pass filter that has an output of J-bits with K-bits of accuracy.

9. A device as recited by claim 3, wherein said first delta sigma modulator incorporates an L-bit quantizer, L-bit output of said first delta sigma modulator is passed through said digital low pass filter, and K-bit output of said digital low pass filter is then passed through a digital to analog converter (DAC).

10. A device as recited by claim 3, wherein said first delta sigma modulator incorporates an L-bit quantizer, L-bit output of said first delta sigma modulator is passed through said digital low pass filter, K-bit output of said digital low pass filter is passed through a digital to analog converter (DAC) which provides said analog output signal, wherein said analog output signal is subtracted from said filtered and delayed analog signal in a subtract circuit.

11. A device as recited by claim 3, wherein said first delta sigma modulator incorporates an L-bit quantizer, L-bit output of said first delta sigma modulator is passed through said digital low pass filter, K-bit output of said digital low pass filter is passed through a digital to analog converter (DAC) which provides said analog output signal, wherein said analog output signal is subtracted from said filtered and delayed analog signal in a subtract circuit, wherein gain is applied to output of said subtract circuit by a gain circuit, thereby providing an amplified error signal for further processing.

12. A device as recited in claim 3 wherein output of said first stage is couple to a second delta sigma modulator.

13. A device having a pipeline delta sigma modulator (PDSM) analog to digital converter (DAC) comprising:

a first stage having first and second signal paths which split an analog input signal, an analog subtract circuit coupled to said first and second signal paths, and a gain circuit coupled to said analog subtract circuit, said first path is defined by an analog delay and a two-stage analog low pass filter, said second signal path is defined by a first-order delta sigma modulator, a two-stage digital low pass filter, and a digital ti analog converter (DAC) said first-order delta sigma modulator incorporates an L-bit quantizer, L-bit output of said first-order delta sigma modulator is passed through said two-stage digital low pass filter, K-bit output of said two stage digital filter is passed through said digital analog converter (DAC) to provide an analog output signal which is an approximation of most significant (K) bits of the analog input signal, said two-stage analog low pass filter and said two-stage digital low pass filter are matched so that the filtered and delayed analog signal and the analog output signal have been subjected to the same transfer function in order to provide a matched passband and step response to the analog output signal, said analog output signal is subtracted from said filtered and delayed analog signal in said analog subtract circuit, and said gain circuit applies gain to output of said analog subtract circuit, thereby providing an amplified error signal; and a second stage having a second first-order delta sigma modulator, said amplified error signal is provided to said second first-order delta sigma modulator for further processing.

14. A device as recited in claim 13 wherein said second stage further comprises a second two-stage digital low pass filter, wherein said second first-order delta sigma modulator produces an L-bit output that is passed through said second two-stage digital low pass filter that provides a J-bit output.

15. A device as recited in claim 13 wherein said second stage further comprises second and third two-stage digital low pass filters, wherein said second first-order delta sigma modulator produces an L-bit output that is passed through said second two-stage digital low pass filter that provides a J-bit output, and wherein the K-bit output of the first stage is additionally processed through said third two-stage digital low pass filter which has a transfer function that corresponds with said second two-stage digital low pass filter to provide an R-bit output.

16. A device as recited in claim 13, wherein said second stage further comprises second and third two-stage digital low pass filters, a digital delay, and a digital error correction circuit, wherein said second first-order delta sigma modulator produces an L-bit output that is passed through said second two-stage digital low pass filter that provides a J-bit output, and wherein the K-bit output of the first stage is additionally processed through said third two-stage digital low pass filter which has a transfer function that corresponds with said second two-stage digital low pass filter to provide an R-bit output, and wherein both the R-bit output from the third digital low pass filter after passing through said digital delay, and the J-bit output of the second digital low pass filter are passed to said digital error correction circuit which produces a P-bit output.

17. A device as recited in claim 13, wherein said PDSM ADC further comprises a digital reconstruction filter, wherein said second stage further comprises second and third two-stage digital low pass filters, a digital delay, and a digital error correction circuit, wherein said second first-order delta sigma modulator produces an L-bit output that is passed through said second two-stage digital low pass filter that provides a J-bit output, and wherein the K-bit output of the first stage is additionally processed through said third two-stage digital low pass filter which has a transfer function that corresponds with said second two-stage digital low pass filter to provide an R-bit output, and wherein both the k-bit output from the third digital low pass filter, after passing through said digital delay, and the J-bit output of the second digital low pass filter are passed to said digital error correction circuit which produces a P-bit output, and wherein said digital reconstruction circuit is adapted to filter and optionally decimate a sampling frequency of the P-bit output of the digital error correction circuit to produce a digital output signal having N-bits of resolution.

18. A device as recited in claim 13, wherein said L-bit quantizer uses a sampling frequency of $f_s$, and the value of K depends on an over sampling retio $(OSR)=f_s/(2*BW)$, where BW is bandwidth of said analog input signal.

19. A device as recited in claim 13, wherein the output of said analog subtract circuit is an error signal that has a magnitude less than $\frac{1}{2}^{K-1}$, where the value of K depends on an over sampling retio $(OSR)=f_s/(2*BW)$, where $f_s$ is a sampling frequency of said L-bit quantizer, and BW is bandwidth of said analog input signal.

20. A device as recited in claim 13, wherein the output of said analog subtract circuit is multiplied by $2^{K-1}$ in said gain circuit so that the amplified error signal has a dynamic range that is the same as the analog input signal.

21. A device as recited in claim 13, wherein $N \geq P$.

22. A device as recited in claim 13, wherein the L-bit output is a sum of a signal component $[z^{-1}Vin(z)]$ and a quantization noise component $[(1-z^{-1})E(z)]$, where $Vin(z)$ is the analog input signal, $E(z)$ is quantization noise resulting from converting the analog input signal to an L-bit digital signal, the signal component $[z^{-1}Vin(z)]$ is the analog input signal delayed by one clock cycle, while the noise component $[(1-z^{-1})E(z)]$ is shaped by a transfer function $(1-z^{-1})$, which as a function of frequency is described by:

$$|1 - z^{-1}| = 2\sin\left(\frac{\pi f}{f_s}\right),$$

where $f_s$ is the sampling frequency of said first order delta sigma modulator.

23. A device as recited in claim 22, wherein a transfer function for each stage of the two-stage digital low pass filter is described by:

$$T_{ave}(z) = \frac{1}{M}\sum_{i=0}^{M-1} z^{-i},$$

where a frequency response of Tave(z) is expressed by:

$$T_{ave}(\omega) = \frac{\frac{1}{M}\sin\left(\frac{\pi M f}{f_s}\right)}{\sin\left(\frac{\pi f}{f_s}\right)} \approx \frac{\sin\left(\frac{\pi M f}{f_s}\right)}{\frac{M \pi f}{f_s}} \equiv \operatorname{sinc}\left(\frac{\pi M f}{f_s}\right),$$

where $M=0.8*f_s/(2*Bandwidth)$.

24. A device as recited in claim 23, wherein the analog output signal ($V_d(z)$) of said DAC is the sum of the analog input signal ($Vin(z)$) and the quantization error ($E_1(z)$) after passing through said two-stage digital low pass filter, which is described by:

$V_d(z)=[Vin(z)+E_1(z)][Tave(z)]^2$.

25. A device as recited in claim 23, wherein a frequency response of said two-stage analog low pass filter is the same as said two stage digital low pass filter, wherein the filtered and delayed analog signal is expressed by: $V'in(z)=Vin(z)[Tave(z)]^2$.

26. A device as recited in claim 23, wherein the output of said analog subtract circuit is expressed by: $V_{sub}(z)=-E_1(z)[Tave(z)]^2$.

27. A device as recited in claim 23, wherein said second stage further comprises a second two-stage digital low pass filter, wherein said second first-order delta sigma modulator produces an L-bit output that is passed through said second two-stage digital low pass filter that provides a J-bit output, and wherein the J-bit output of the second two-stage digital low pass filter can be expressed by: $V_{dJ}(z)=[-E_1(z)2^{K-1}T^2ave(z)+E_2(z)]T^2ave(z)$, where $E_2(z)$ is a noise shaped quantization error of said second first-order delta sigma modulator.

28. A device as recited in claim 27, wherein the K-bit digital output of the first stage is passed through a second digital low pass avenging filter to produce an R-bit signal that can be expressed as: $V_{dR}(z)=[Vin(z)+E_1(z)]T^4ave(z)$.

29. A device as recited in claim 28, wherein said second stage further comprises a digital error correction circuit, wherein the digital error correction circuit adds $V_{dJ}(z)$ and $V_{dR}(z)$ after shifting $V_{dJ}(z)$ k−1 places to the right (divide by $2^{K-1}$) to obtain a P-bit signal, which is described by: $V_{dP}(z)=Vin(z)T^4ave(z)+E_2(z)T^2ave(z)/2^{K-1}$.

30. A device as recited in claim 29, wherein said second stage further comprises a digital reconstruction filter, said digital reconstruction filter has a frequency response of $T^4ave(z)$ for frequencies in the pass band to provide a final resolution of N-bits where N>2K.

* * * * *

UNITED STATES PATENT AND TRADEMARK OFFICE
CERTIFICATE OF CORRECTION

| | | |
|---|---|---|
| PATENT NO. | : 7,034,730 B2 | Page 1 of 1 |
| APPLICATION NO. | : 10/957354 | |
| DATED | : April 25, 2006 | |
| INVENTOR(S) | : Raymond E. Siferd and Saiyu Ren | |

It is certified that error appears in the above-identified patent and that said Letters Patent is hereby corrected as shown below:

Column 12, Line 49, "both the k-bit" should read --both the R-bit--
Column 12, Line 60, "sampling retio" should read --sampling ratio--
Column 12, Line 65, "sampling retio" should read --sampling ratio--
Column 13, Line 5, "recited in claim 13," should read --recited in claim 17,--

Signed and Sealed this

Seventeenth Day of October, 2006

JON W. DUDAS
*Director of the United States Patent and Trademark Office*